Figure 1:
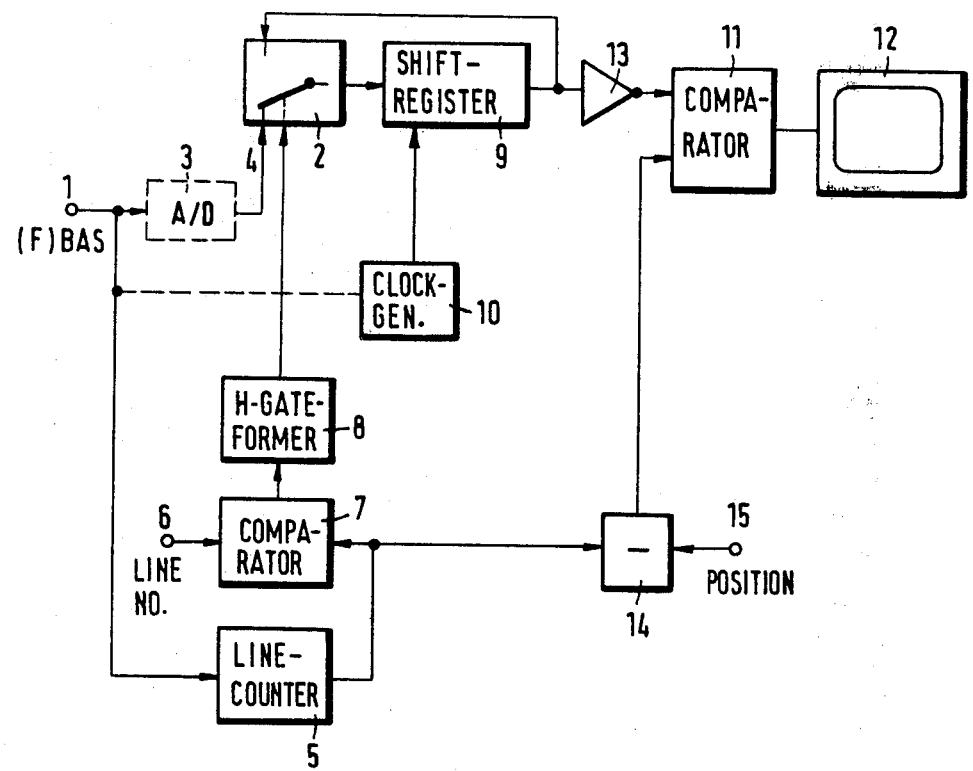

United States Patent [19]

Heitmann et al.

[11] 4,276,563
[45] Jun. 30, 1981

[54] REPRESENTING A VIDEO SIGNAL UPON THE PICTURE SCREEN OF A VIDEO DISPLAY DEVICE

[75] Inventors: Jürgen Heitmann, Seeheim; Gerhard Illetschko; Hans-Peter Maly, both of Darmstadt, all of Fed. Rep. of Germany

[73] Assignee: Robert Bosch GmbH, Stuttgart, Fed. Rep. of Germany

[21] Appl. No.: 857,024

[22] Filed: Dec. 2, 1977

[30] Foreign Application Priority Data

Dec. 4, 1976 [DE] Fed. Rep. of Germany ....... 2655133

[51] Int. Cl.³ .............................................. H04N 7/02
[52] U.S. Cl. ..................................... 358/139; 340/722
[58] Field of Search ........................ 358/107, 139, 93; 340/324 AD, 722, 753

[56] References Cited

U.S. PATENT DOCUMENTS

| | | | |
|---|---|---|---|
| 3,337,684 | 8/1967 | Sadler | 358/139 |
| 3,648,270 | 3/1972 | Metz et al. | 340/324 AD |
| 3,678,498 | 7/1972 | Nagamatsu et al. | 340/324 AD |
| 3,739,222 | 6/1973 | Hurd | 340/324 AD |
| 3,752,917 | 8/1973 | Foley et al. | 358/93 |
| 3,894,292 | 7/1975 | Wilkinson et al. | 340/324 AD |
| 3,909,521 | 9/1975 | Hunt et al. | 358/113 |
| 3,947,628 | 3/1976 | Alien et al. | 358/93 |
| 3,952,149 | 4/1976 | van den Berg | 358/139 |
| 3,971,068 | 7/1976 | Gerhardt et al. | 358/160 |
| 3,984,862 | 10/1976 | Jolz | 340/324 AD |
| 4,058,826 | 11/1977 | Schneider | 358/139 |

OTHER PUBLICATIONS

Southworth-A New Method Of Television Waveform Display-Jour. of Smpte, vol. 73-Sep. 1966-pp. 848-850.

Primary Examiner—Joseph A. Orsino, Jr.
Attorney, Agent, or Firm—Quaintance, Murphy & Richardson

[57] ABSTRACT

A method and apparatus for representing the amplitude curve of a selected portion of a video signal upon the picture screen of a video display device, at least the selected portion being in digital form and not requiring conversion to analog form prior to such representation.

This is achieved by using the line structure of the line raster produced on the picture screen of the video display device as a digital-analog converter. The range of possible digital values for the individual picture elements of the selected line of the video signal are allocated as reference values to respective lines of the line raster, and during each line period of the line raster the digital values of the elements are compared in succession with the appertaining reference value. When during any line period of the line raster the compared values agree the picture screen is momentarily brightened, so that each picture element of the selected line is represented on the screen with a vertical displacement determined by its digital value, so that an amplitude curve similar to an oscillogram is produced having a horizontal time axis.

In a further embodiment of the invention, arranged to display the amplitude curve of selected picture elements each taken from a respective line of the video signal, the reference values are allocated to respective columns of the line raster of the display device. The result is the production of an oscillogram on the picture screen having a vertical time axis.

1 Claim, 5 Drawing Figures

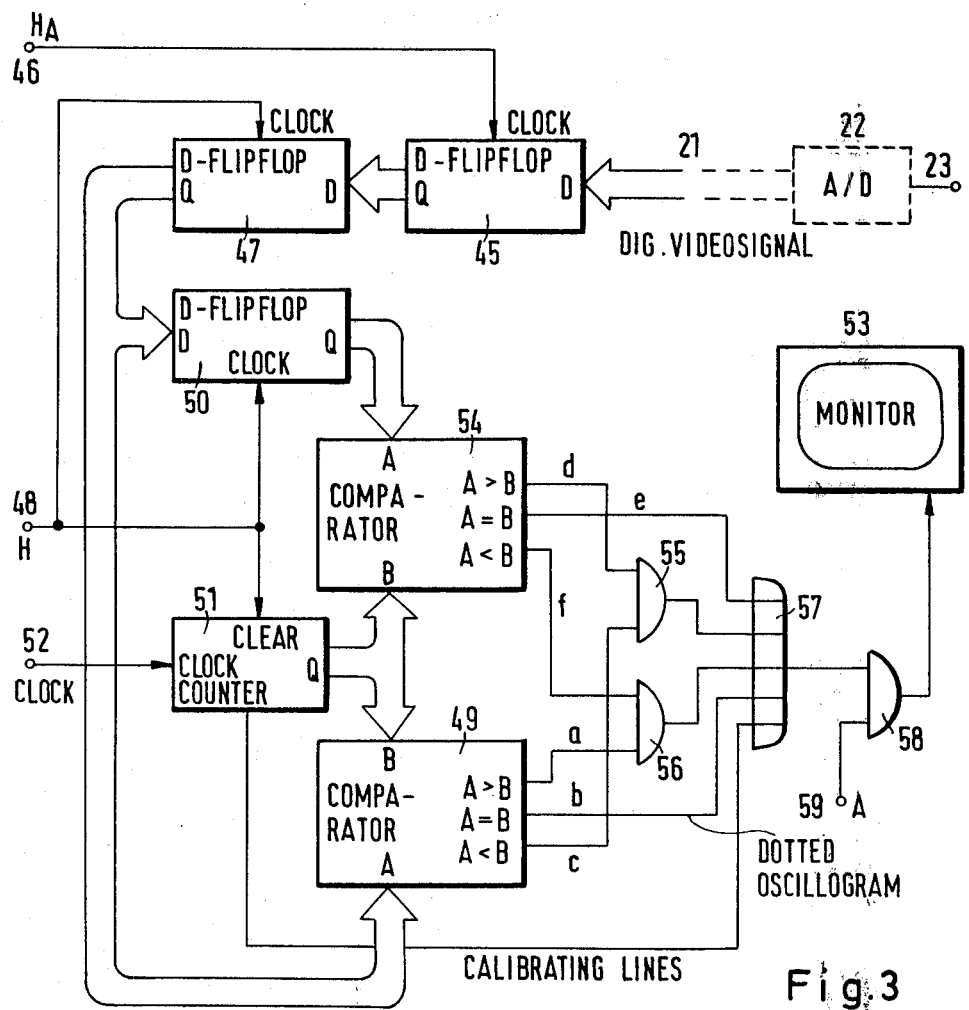
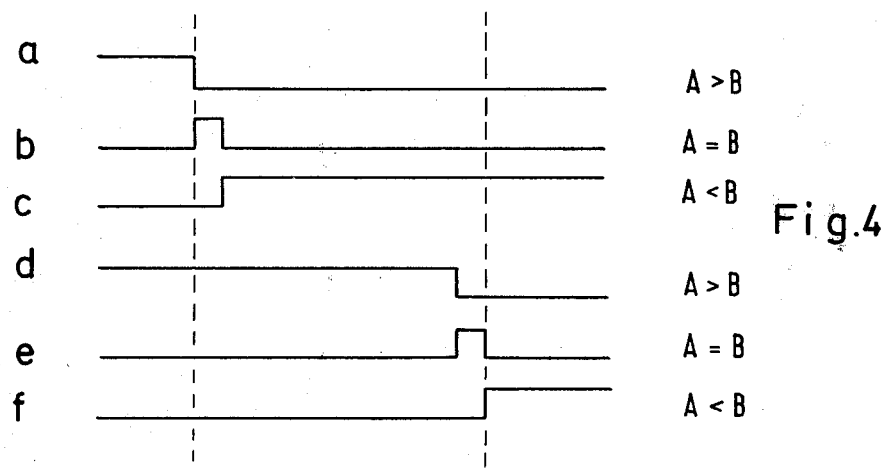

REPRESENTING A VIDEO SIGNAL UPON THE PICTURE SCREEN OF A VIDEO DISPLAY DEVICE

This invention relates to a method and apparatus for representing a selected portion of a video signal upon the picture screen of a video display device.

In the periodical "Elektor", December 1971, pages 1234 to 1242, there is disclosed an arrangement for representing the voltage curve of a periodic signal upon the picture screen of a domestic television receiver which is scanned according to the line raster technique. In this arrangement, by the use of a comparator, a horizontal frequency sawtooth signal is compared with the periodic signal to be represented. Upon reaching a condition of voltage parity in the signal comparison, the electron beam of the picture tube is unblanked whereupon a corresponding picture element is brightened on the picture screen. However, in this method of operation the voltage curve of the signal to be represented is rotated through 90°, i.e. its time axis extends in the vertical direction. Moreover it is possible only to represent low frequency signals, of a frequency smaller than the horizontal scanning frequency of the picture tube of the domestic television receiver. A further disadvantage is that only analog signals can be represented. Digital signals, e.g. PCM coded video signals, must first be converted into analog form when using the arrangement described above.

It is therefore a primary object of the invention to provide a method of representing a selected portion of a video signal upon the picture screen of a video display device, which method is able to handle digital signals directly without conversion to analog form.

Accordingly, the invention provides a method of representing a selected portion of a video signal upon the picture screen of a video display device, at least the selected portion of the video signal being in digital form, wherein at least some of the range of possible digital values of the individual picture elements of the selected portion of the video signal are allocated to respective lines and/or columns of a line raster reproduced upon the picture screen of the video display device, and wherein during the reproduction of the raster the brightness thereof is modulated in accordance with the picture elements of the selected portion of the video signal in such manner that each such element produces on the screen a contrasting brightness in that line or column if any having the same digital value allocated thereto as the digital value of the element, whereby each picture element of the selected portion of the video signal thus represented on the screen has a respective vertical or horizontal displacement determined by its digital value.

It is a further object of the invention to provide an apparatus, operating according to the method of the invention, which is adapted to represent a selected digitally coded line of a video signal in a horizontal position upon the picture screen of a video display device.

Thus, the invention further provides an apparatus for representing on the picture screen of a video display device the amplitude of a selected line of a video signal as a function of time, at least the selected line being in digital form, comprising storage means for storing the digital values of the individual picture elements of the selected line, means for supplying as reference values at least some of the range of possible digital values of the picture elements of the selected line of the video signal, comparison means for comparing, during each of a plurality of line periods of a line raster reproduced upon the picture screen of the video display device, the digital values of the individual elements of the selected line successively with a respective reference value, whereby each reference value is effectively allocated to a respective line of the line raster, and means for causing a brightness contrast in the respective raster line when the digital value of the element and the reference value are the same.

Also, it is an object of the invention to provide an apparatus, operating according to the method of the invention, which is adapted to represent a selected digitally coded vertical frequency portion of a video signal in a vertical position on the picture screen of a video display device.

Accordingly, the invention further provides an apparatus for representing on the picture screen of a video display device the amplitudes of a selected plurality of digitally coded picture elements derived from respective lines of a video signal, the apparatus comprising selecting means for selecting desired picture elements from respective lines of the video signal, storage means for storing the digital value of each selected picture element, means for supplying as reference values at least some of the range of possible digital values of the selected picture elements, comparison means for comparing each stored digital value successively with the reference values during a respective line period of a line raster reproduced upon the picture screen of the video display device, the successive reference values being presented in substantially identical order and timing in each line period of the line raster whereby each reference value is effectively allocated to a respective column of the line raster, and means for causing a brightness contrast in the respective raster line when the stored digital value and the current reference value are the same.

Figure 2:
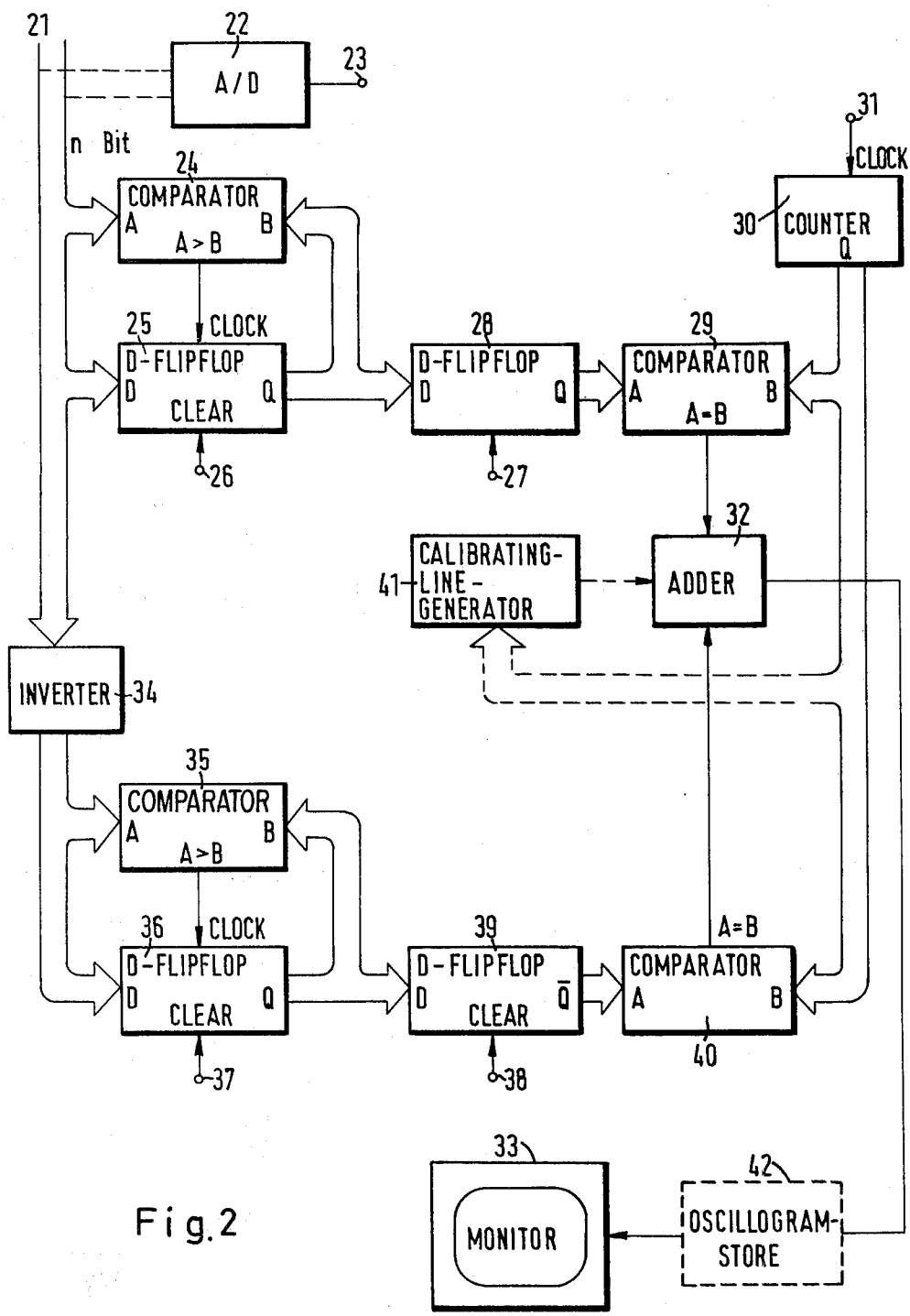
Figure 5:
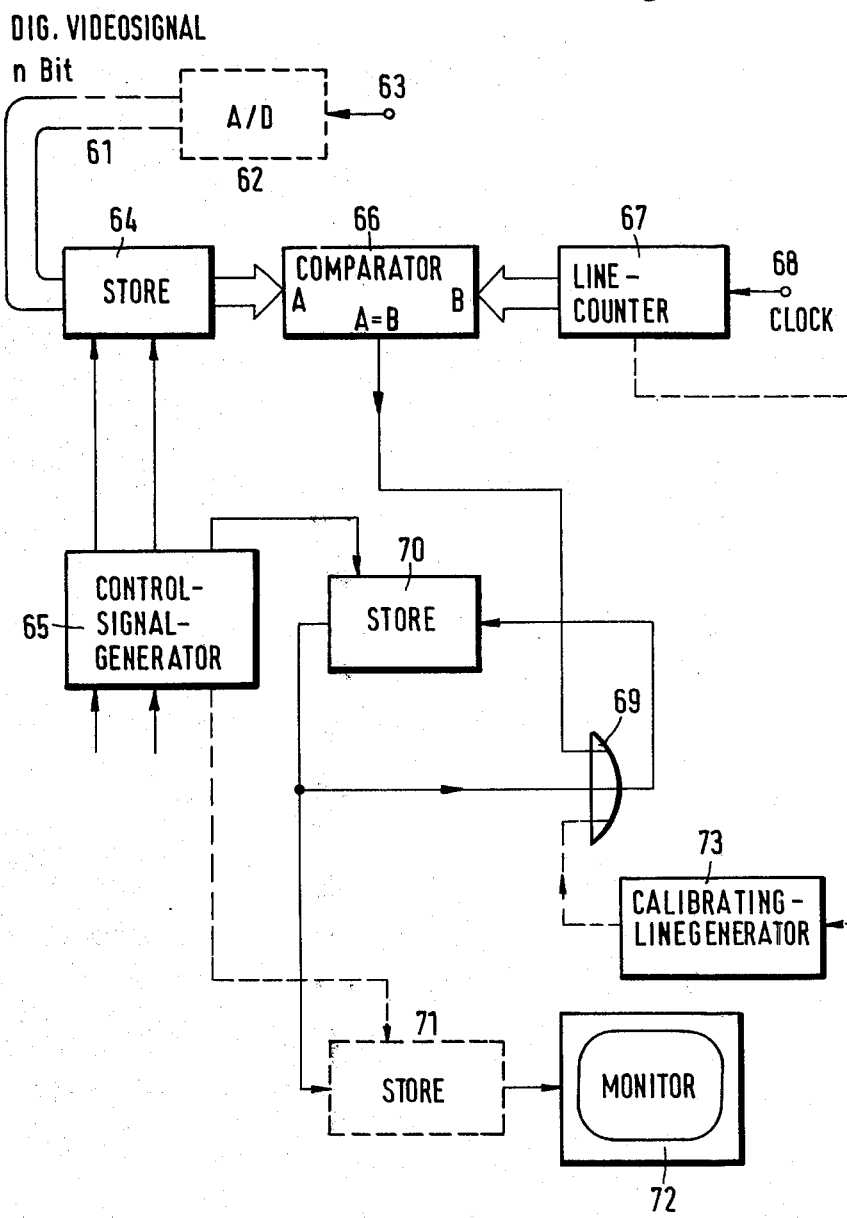

Embodiments of the invention will now be described with reference to the accompanying drawings, in which:

FIG. 1 is a block schematic diagram of a first embodiment of an apparatus operating according to the method of the invention, FIG. 2 is a block schematic diagram of a second embodiment of an apparatus operating according to the method of the invention, FIG. 3 is a block schematic diagram of a third embodiment of an apparatus operating according to the method of the invention, FIG. 4 is a voltage time diagram for explaining the operation of FIG. 3, and FIG. 5 is a block schematic diagram of a fourth embodiment of an apparatus operating according to the method of the invention.

Referring now to FIG. 1, this is a block schematic diagram of an apparatus for representing on a video display device the voltage amplitude curve of a selected line of a video signal as a function of time, the time axis being horizontal on the picture screen of the device.

In the figure a colour video signal (F) BAS is delivered through a terminal 1 to a controlled selector switch 2. In the case where the colour video signal is available at the terminal 1 in analog rather than digital form, there is interposed between the terminal 1 and the controlled selector switch 2 an analog-digital converter 3. The converter 3 is not required where the video signal is already in digital (e.g. PCM) form. In either case, therefore, the video signal is available in digital form (i.e. in the form of individual digitally coded picture elements) at the input line 4 of the controlled selector switch 2. The controlled contact path of the controlled selector switch 2 is switched, by the presence of a gate pulse, to the position shown for the duration of one line period only during a frame of the video signal. The position of the line period within the frame is selectable. Normally, interest will lie in the voltage curve of a definite line, e.g. a test line in the vertical blanking gap of the video signal.

The control of the contact path of the controlled selector switch 2 is effected in the following manner. The horizontal or line periods of the colour video signal available at terminal 1 are continuously counted by a line counter 5, and the running total registered by the counter 5 is compared in a comparator 7 with a selected line number, for example that of the desired test line, applied at terminal 6. When the digital number applied at terminal 6 coincides with the counted digital number at the output of the line counter 5, the output of the comparator 7 delivers a coincidence signal to a pulse former stage 8. The latter provides as output a gate pulse for the switch 2 having a pulse repetition frequency which corresponds to the frame frequency and a pulse width which is equal to the duration of a line period of the video signal. By this means the selected line is applied at the input of a shift register 9 connected to follow the controlled selector switch 2. By means of a clock signal produced in a clock generator 10, this selected line is shifted into the shift register 9, picture element by picture element so that at the end of the gate pulse a complete line in digital form is stored in the shift register 9.

For the analog representation of the stored line upon the picture screen of a video display device 12 operating according to the same standard as and synchronised with the video signal applied at 1, the line structure of the line raster of the device 12 is used in effect as a digital-analog converter. For this purpose a respective one of the range of possible digital amplitude values of the elements of the stored video line is allocated as a reference value to a different line of the line raster. In the present case let it be assumed that each individual picture element of the selected video line has been digitalized with 8 bits. This corresponds to a range of 256 possible digital amplitude values (0–255 inclusive) for each element. Further let it be assumed that to the 100th line of the line raster of the device 12 there is allocated as reference value the digital value 255, to the 101st line there is allocated the digital value 254, to the 102nd line there is allocated the digital value 253, and so on, so that the digital value 0 is allocated as reference value to the 355th line of the line raster. This allocation is effected as follows.

After the storage in the shift register 9 of the selected line, the contact path of the controlled selector switch 2 reverts, by the absence of a gating pulse from 8, to the upper position so that the output and the input of the shift register 9 are connected together. By the application of a suitable clock signal the stored video line is caused to circulate at horizontal frequency in the shift register 9, which is thus connected as a ring store. The individual bits of the digital values at the output of the register 9 are inverted in an inverting stage 13, and a comparator 11 compares, during each raster line of the device 12, the thus inverted digital amplitude values of the successive picture elements of the stored line with the respective line number from counter 5 less a constant (in the present case the digital value 100) applied to the input 15 of a subtraction stage 14. This is equivalent to comparing the uninverted digital values of the picture elements of the stored line, during each of the raster lines 100 to 355, with a respective one of the reference values 255 to 0 in that order, which is the allocation assumed above.

Each time that the digital value of a picture element is the same as that of the currently allocated reference value, the comparator 11 is arranged to release a signal which causes a momentary brightening of the picture screen of the device 12. Thus under these conditions, in the 100th line of the line raster only those picture elements will be brightened which have a digital value of 255, in the 101th line brightening will occur only in respect of the picture elements having a digital value of 254, and so on. The result is that the selected line is represented on the picture screen of the device 12 by a plurality of bright spots each corresponding to a picture element of the selected line and having a vertical displacement above raster line 355 proportional to its digital value. The effect is, therefore, of a substantially continuous curve similar to a conventional oscillogram.

In order to displace the oscillogram in a vertical direction upon the picture screen, it is arranged that the digital number applied at the terminal 15, which number is subtracted from the line number determined by the line counter 5, may be varied. In the above example the number subtracted was assumed to be 100, but if this is changed the effect is to vary, by the same number of raster lines in each case, the allocation of reference values to the lines of the raster. Thus the vertical position of the oscillogram may be adjusted on the picture screen without affecting its overall shape.

Where it is required the analog-digital converter 3 is preferably designed so that, in the case of a band width of 5 MHz of the video line to be represented, the analog voltage of the line is sampled at intervals of 100 nsec. In the case of a selected line which does not change from one frame to the next, such as a test line, the sampling can take place in such manner that, using a sampling and holding circuit, in a first frame the first picture element of the selected line has its amplitude sampled and held, in the next frame the second picture element of the selected line is sampled and held, in the third frame the third picture element of the selected line is sampled and held, and so on, each held amplitude value being subjected to a subsequent digital quantization. Thus, the selected video line is completely scanned and digitally converted after 64 $\mu$s/100 ns frames, in the case of the 625 line standard. Preferably in such case the analog-digital converter 3 operates according to the so-called economical counting principle in the digital quantization of the sampled amplitudes, whereby in successive lines of the picture successively higher quantization stages are adopted for comparison with the sampled amplitude value.

As a measuring technique for evaluating the oscillogram amplitudes upon the picture screen, certain preselected lines in the line raster of the device 12 may be brightened as a whole for example. These lines may then serve as reference lines if the reference values allocated thereto are known.

For the purpose of achieving a vectorial representation of the selected video lines, it is necessary in principle to employ two similar circuits corresponding to the above described block schematic diagram. In such a case, however, in respect of the x direction the range of possible digital values of the picture elements of a selected video line are not associated with predetermined lines, but with predetermined columns, of the television raster. A brightening then only takes place in the event of coincidence between two associated signals.

Referring now to FIG. 2, this is a block schematic diagram of an apparatus for deriving a vertical oscillogram of the largest and the smallest digital values within each line period of a digital video signal.

In FIG. 2 a digital video signal is supplied to the apparatus at the point 21. This digital video signal may be available direct or may be delivered, for example, from the output of an analog-digital converter 22 which receives from a video signal source (not shown in the drawing) an analog video signal at the terminal 23. Let it be assumed that the digital video signal is available with a word length of n parallel bits. The digital video signal is delivered to one input A of a comparator 24 and to the data input D of a D flip-flop 25. The output Q of the D flip-flop 25 is connected to the input B of the comparator 24. The comparator 24 is provided with an output A>B. A comparator provided with such an output is available in integrated circuit form under the type number SN 7485. The A>B output of the comparator 24 is connected to the CLOCK pulse input of the D flip-flop 25. An erase input marked CLEAR of the D flip-flop 25 receives a horizontal frequency pulse signal over a terminal 26.

The comparator 24 and the D flip-flop 25 serve for a determination of the highest digital value of a picture element during each line period of the digital video signal at 21. In the event that the comparator 24 determines that the digital value at the A input is greater than that at the B input, a clock pulse is delivered, which has the effect of transferring the binary information available at the date input D of the D flip-flop 25 to the output Q. This binary information remains at the output Q of the D flip-flop 25 until the next clock pulse is received. The horizontal frequency pulse signal delivered through the terminal 26 causes, independently of the clock pulse, a resetting of the D flip-flop to the digital value zero. At the end of each line period, by means of control exercised by a horizontal frequency pulse signal available at a terminal 27, the binary information situated at the output of the D flip-flop 25 is temporarily stored in a following connected D flip-flop 28 for the duration of one line period, and is delivered to an input A of a further comparator 29. An input B of the comparator 29 is connected to an output of a binary counter 30 to the terminal 31 of which there are delivered clock pulses whose frequency is an integral multiple of the line frequency of a video display device 33. The counter 30 thus establishes at the input B of the comparator 29 during each line period a succession of digital reference values, the clock frequency being sufficiently high that these reference values include the range of possible digital values of the picture elements of the video signal at 21. Furthermore, as the counter 30 is reset at the beginning of each line period each reference value is allocated to a respective column of the line raster on the device 33.

During each line period, when the comparator 9 establishes indentity in the binary values of the information lying at the inputs A and B, a pulse is generated which, via an adding stage 32, serves as an unblanking pulse for the device 33. Thus, in each line period, that picture element having the greatest digital value causes the picture screen of the device 33 to be brightened in the column thereof having the same digital value allocated thereto. There will thus appear in the line raster upon the picture screen a vertical oscillogram of the maximum amplitudes of the picture elements in the individual lines of the video signal at 21, with the direction left to right corresponding to increasing amplitude.

In a similar manner to the production of a vertical oscillogram of the highest digital values within each line period of the digital video signal, one can also produce a vertical oscillogram of the smallest digital values within each line period of the digital video signal. For this purpose, by means of an inverter 34, the applied digital video signal is inverted, and is delivered to the input A of a comparator 35 and to the data input D of a D flip-flop 36. The output Q of the D flip-flop 36 is connected to the input B of the comparator 35. Clocking of the D flip-flop 36 is effected by pulses which are available at the output A>B of the comparator 35. In synchronism with the action of the D flip-flop 25, the D flip-flop 36 is also cleared by means of a horizontal frequency pulse signal available at a terminal 37. However, previous to this, by the control of a horizontal frequency pulse signal available at the terminal 38 in synchronism with that at 27, the information located at the output Q of the D flip-flop 36 is temporarily stored in a further D flip-flop 39, and is also delivered inverted from the $\overline{Q}$ output of the flip-flop 39 to the input A of a further comparator 40. A further input B of the comparator 40 is connected to the output of the binary counter 30. When the comparator 40 determines parity of value between the digital values of the amplitude minimum thus available at its input A and the reference value at its input B, a pulse is delivered also through the adding stage 32, to the monitor 33 and there causes momentary brightening of the line raster in the manner previously described. The totality of all the brightened up picture elements in each line produces a vertical oscillogram corresponding to the smallest digital values within each line period of the digital video signal applied at the point 21.

The time axis of the oscillograms represented upon the monitor 33 proceeds vertically with respect to the line direction from the top to the bottom of the picture screen. If the binary counter 30 begins to count from zero at the beginning of each line period, then the picture elements having the smallest amplitude values are indicated at the left hand side of the picture screen of the monitor 33 and those with the largest amplitude values are indicated at the right hand side. By a suitable choice of the frequency of the clock signal at 31 it is possible to obtain a desired scale in the horizontal direction of the picture screen, as the clock frequency determines the width of the columns having respective reference values allocated thereto.

A saving in the amount of capital expenditure on circuitry can be achieved by eliminating the stages 35 to 39 if the greatest and smallest digital values are determined alternately line by line. This can be achieved by supplying non-inverted and inverted digital video signals alternately line by line to 24 and 25, and by switching alternately line by line between the Q and $\overline{Q}$ outputs of the D flip-flop 28. Instead of line by line, the alternation can be frame by frame if desired.

For measurement purposes it is furthermore possible to superimpose calibration or reference lines upon the vertical oscillogram on the picture screen of the monitor 33. The production of calibration lines takes place in a calibration line generator 41. The derivation of calibration lines takes place in a manner equivalent to the method above described, except that instead of using a digital video signal a digital reference voltage is processed having an amplitude corresponding to the desired column of the line raster in which the calibration line is to appear. If desired, it is possible to produce the calibration lines as dashed lines by reducing the reference voltage to zero at regular intervals. Furthermore it is possible for the dashes in the calibration lines to be produced with reference to a predetermined time scale so that an optically legible time base is obtained.

If it is desired that the vertical oscillograms represented upon the picture screen of the monitor 33 be observable for a long period of time, independently of the applied digital signal at 21, then it is possible to provide between the adding stage 32 and the monitor 33 a storage device 42 for storing the pulses which bring about the raster brightening operation. The control of this store is effected by control signals which are derived from the synchronous component of the digital video signal applied at the point 21.

FIG. 3 is a block diagram of an apparatus for producing a vertical oscillogram of the picture elements occurring in the same position in successive lines of an input digital video signal, i.e. elements which would be reproduced vertically below one another if the digital video signal were reproduced according to conventional practice.

In the block schematic diagram of FIG. 3 the n-bit digital video signal applied at the point 21 is delivered to the data input D of a D flip-flop 45. Upon the occurrence of a horizontal frequency scanning pulse $H_A$ at the terminal 46, the current digital value of the video signal is taken from the output Q of the D flip-flop 45 and conveyed to the data input C of a further D flip-flop 47. In each line of the video signal at 21 the pulse $H_A$ selects the element at the same position for transference to the flip-flop 47, whereby the digital values processed are those corresponding to picture elements which would be vertically aligned in conventional reproduction. The time of occurrence of the pulses $H_A$ may be adjusted so as to select a different line position of the elements to be evaluated. In dependence upon a horizontal frequency pulse signal applied at a terminal 48, the digital information situated at the input D of the flip-flop 47 is accepted by the output Q and remains there available and uninterrupted for the duration of the next line period. The output Q of the D flip-flop 47 is connected to the input A of a comparator 49 and to the D input of a further D flip-flop 50. The other input B of the comparator 49 is connected to the output Q of a binary counter 51. This binary counter 51 counts the pulses of a clock signal applied at a terminal 52, the clock pulses having a frequency which is an integral multiple of the line frequency. The digital value available at the output of the binary counter 51 increases from 0 to $2^{n-1}$ during each line period and thus allocates to vertical columns of the line raster of a monitor 53 respective reference values in the same way as in FIG. 2. During each line period the comparator 49 delivers a logical 1 at an output A=B when the binary counter 51 achieves a value equal to that of the scanned digital picture signal at the A input of 49. In the simplest case this logical signal can be indicated directly upon the monitor 53 by brightness control of the picture screen in the manner previously described. Because each individual line of the digital video signal is evaluated in such manner, there will thus be produced on the line raster of the monitor 53 a punctiform vertical oscillogram.

If the digital values of adjacent lines differ from each other materially, then the brightened picture elements will appear upon the picture screen of the monitor 53 in a scattered formation, which will lack the desired substantially continuous line formation of the previously described oscillograms. The D flip-flop 50 serves to connect by horizontal lines the individual points of the vertical oscillogram, this flip-flop cooperating with a comparator 54 and a logic network comprising two AND gates 55 and 56 and an OR gate 57. Upon the appearance of a pulse from the line frequency signal applied to the terminal 48, the information situated at the data input of the D flip-flop 50 is accepted at the output Q and delivered to an input A of the comparator 54. Thus during the subsequent line period the digital value applied to the A input of the comparator 54 is derived from the previous line to that applied at the A input of the comparator 49. The other input B of the comparator 54 is connected to the output of the binary counter 51. The comparators 49, 54 are provided each with three outputs A>B, A=B and A<B. Such comparators are available in integrated form under the type numbers SN 7485. In the voltage-time diagrams of FIG. 3a indicates the binary signal at the output A>B, b the binary signal at the output A=B, and c the binary signal at the output A<B of the comparator 49, in each case for a digital value at input A lying adjacent the left hand dashed line and with B increasing from left to right. For the comparator 34 $d$ indicates the binary signal at the output A>B, $e$ the signal at the output A=B, and $f$ the signal at the output A<B, in this case for a digital value at input A lying adjacent the right hand dashed line. By the logic interaction of the logic network 55, 56 and 57 the result is achieved that the output signal of 57 assumes a logical 1 value if in the actual line in question A=B, or in the previous line A=B, or when the count at B is situated between the two A values.

In addition to generating the digital reference values for the comparators 49 and 54, the binary counter 51 can also serve the function of producing calibration lines which appear upon the line raster in the form of vertical lines at, for example, the amplitude levels 0%, 25%, 50%, 75% and 100%.

An AND gate 58 connected to follow the OR gate 57 serves for blanking out the retained signal by means of a blanking signal available at a terminal 39.

FIG. 5 illustrates an apparatus similar in principle to that of FIG. 1, but wherein there are simultaneously reproduced in a superimposed arrangement upon the picture screen of the video display device the horizontal oscillograms of a plurality of selected line periods of a digital video signal.

In FIG. 5 a digital video signal is available at the point 61. This digital video signal may be produced, for example, by an analog-digital conversion process in an analog-digital converter 62, to a terminal 63 of which an analog video signal is delivered from a video signal source (not shown). The digital video signal may have a word length of n bits and be available in parallel form. Such a video signal is delivered to the input of a store 64, the storage capacity of which is sufficient for storing the digital values of a complete line period. The control of the store 4 in respect of the reading in and reading out operations is effected by two signals, which are derived in a control signal generator 65. Thus a certain line of the video signal at 61 may be selected and the digital values of the individual elements thereof read into and stored in the store 64. The digital information circulates in the store 10 at line frequency. During the subsequent frame period the digital values successively available at the output of the store 64 as the information circulates are delivered to an input A of a comparator 66. To another input B of the comparator 66 is applied the digital value counted by a line counter 67, to which there is delivered for counting from a terminal 68 a horizontal frequency pulse signal functioning as a clock signal. The line counter 67 is reset in each vertical period and thus establishes the allocation of reference values to the raster lines of the display device 72 in a similar way to FIG. 1. Each time the information applied to the comparator 66 from the output of the line counter 67 is equal to the digital information from the output of the store 64, a recognition signal is produced at the output A=B of the comparator 66, which signal represents an element of the desired oscillogram and is applied through an OR gate 69 to an input of a further store 70. A control signal for writing-in the recognition signal available at the input of the store 70 is generated in the control signal generator 65. The output of the store 70 is connected to its input through the OR gate 69. By this means it is possible for the information which has been written in to the store 70 by the recognition signal to circulate in a manner similar to that in a ring store. In the present example the storage capacity of the store 70 is so designed that it is possible to store a complete frame of information. By the provision of a further store 71 (indicated in dashed lines) the signal available at the output of the store 70 is delivered to the monitor 72, and in the manner previously described causes a momentary brightening of the line raster upon the picture screen. By means of a calibration line generator 73 it is possible to superimpose calibration lines upon the oscillograms reproduced upon the picture screen of the monitor 72. For this purpose pulse signals are delivered from the line counter to the calibrating line generator 73 for the purpose of synchronization. The signals received at the output of the calibrating line generator 73 can be added, through the OR gate 69, to the information circulating in the ring mode in the store 70.

During the successive comparison of the individual digital values circulating in the store 64 with the respective reference values established by the counter 67, all the recognition pulses (oscillogram elements) from the comparator 66 are written into the store 70 and circulate therein at the frame frequency.

The same procedure is now followed for one or more succeeding lines of the video signal at 61, and in each case the newly arriving oscillogram elements, if they differ from those which have already been inscribed, are additionally recorded in the store 70. This procedure continues until as many as desired or all of the lines of the video signal have been evaluated and the respective newly arriving oscillogram elements have been inscribed in the store 70. Thus the content of the store 70 represents a sum total of the oscillograms of (in the extreme case) all the lines comprising a frame and can be taken into the following store 71. The content of this store is read out at frame frequency and the signal thus produced is delivered to the monitor 72. The store 71 may be omitted if the structure of the sum oscillogram, and its clearance upon switching off the monitor 72, is found not to introduce disturbance.

The installation of the store 71 is of advantage, however, in that by taking over the information contained in the store 70, the store 70 can be cleared and a new sum oscillogram can be established. The establishment of a sum oscillogram may be accelerated by evaluating, not each line, but each nth line of the video signal. A further possibility of increasing the speed of oscillogram production when superinscribing horizontal oscillograms may be achieved by provision of a plurality of stores 64 and comparators 66. By such means it is possible to obtain parallel processing of all the lines in a frame.

The operation of the apparatus is not restricted to what has been described above. By variations in the control of the stores it would, for example, be possible to represent only one selected line of the digital video signal as a horizontal oscillogram, or to select a plurality but less than all of lines of the digital video signal for superimposed representation. This possibility is indicated in the drawing by the two additional lines shown at the left hand side underneath the block symbol of the control signal generator 65.

We claim:

1. A method of displaying a selected portion of a video signal upon the picture screen of a video display device employing a horizontal line raster, at least the selected portion of the video signal being in digital form, wherein for the purpose of representing a selected line of the video signal as a function of x and y, the following steps are performed for deriving the y function:

(a) the individual picture elements of the selected line of the video signal are scanned for a complete frame in the line direction and their voltage values are determined, (b) each determined voltage value is subjected to an analog-digital conversion, (c) the individual analog-digital converted voltage values are stored, (d) there is associated with each stored voltage value one line of the line raster upon the picture screen of the video display device in such a manner that equal amplitudes correspond to the same lines, and the following steps are performed for deriving the x function:

(a) the individual picture elements of the selected line of the video signal are scanned frame by frame in the line direction and their voltage values are determined, (b) each determined voltage value is subjected to analog-digital conversion, (c) the individual analog-digital converted values are stored, (d) with each stored voltage value there is associated one column of a line raster subdivided into a series of columns, in such manner that equal amplitudes correspond to the same columns, and one of the picture elements in the associated line and column is contrasted in respect of its brightness with respect to other picture elements of the line raster, whereby each picture element of the video signal thus represented on the screen has a respective vertical and horizontal displacement determined by its digital value.

* * * * *